United States Patent
Gregor et al.

(10) Patent No.: US 6,252,270 B1
(45) Date of Patent: Jun. 26, 2001

(54) INCREASED CYCLE SPECIFICATION FOR FLOATING-GATE AND METHOD OF MANUFACTURE THEREOF

(75) Inventors: Richard W. Gregor, Winter Park; Isik C. Kizilyalli; Ranbir Singh, both of Orlando, all of FL (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 08/848,114

(22) Filed: Apr. 28, 1997

(51) Int. Cl.$^7$ .................... H01L 29/788; H01L 29/792
(52) U.S. Cl. .................... 257/315; 257/316; 257/321; 257/322; 257/324; 257/325
(58) Field of Search .................... 257/315, 316, 257/321, 322, 324, 325, 645, 651

(56) References Cited

U.S. PATENT DOCUMENTS

| | | |
|---|---|---|
| 3,903,325 | 9/1975 | Horiuchi . |
| 4,268,321 | 5/1981 | Meguro . |
| 4,268,951 | 5/1981 | Elliott et al. . |
| 4,620,211 | 10/1986 | Baliga et al. . |
| 4,851,370 | 7/1989 | Doklan et al. . |
| 5,248,348 | 9/1993 | Myachi et al. . |
| 5,304,830 | 4/1994 | Sato . |
| 5,352,636 | 10/1994 | Beinglass . |
| 5,378,541 | 1/1995 | Ihara et al. . |
| 5,595,927 | 1/1997 | Chen et al. . |
| 5,642,014 | 6/1997 | Hillenius . |
| 5,646,050 | 7/1997 | Li et al. . |
| 5,744,202 | * 4/1998 | Nickel .................... 427/527 |
| 5,776,831 | 7/1998 | Padmanabhan et al. . |
| 5,830,575 | * 11/1998 | Warren et al. .................... 428/404 |
| 5,872,387 | 2/1999 | Lyding et al. . |
| 5,990,008 | 11/1999 | Koyama et al. . |

FOREIGN PATENT DOCUMENTS

| | | |
|---|---|---|
| 61-264350 | 11/1986 | (JP) . |
| 64-41211 | 2/1989 | (JP) . |
| 1-211970 | 8/1989 | (JP) . |
| 2-277269 | * 11/1990 | (JP) . |
| 2-277269A | 11/1990 | (JP) . |
| 3-222321 | 10/1991 | (JP) . |
| 4-29312 | 1/1992 | (JP) . |
| 4-342121 | 11/1992 | (JP) . |
| 4-342122 | 11/1992 | (JP) . |
| WO 94/19829 | 2/1994 | (WO) . |

OTHER PUBLICATIONS

Kizilyalli et al., "Deuterium Post–Metal Annealing of MOS-FET's for Improved Hot Carrier Reliabilty", IEEE Electron Device Letters, vol. 18, No. 3, Mar. 1997.*

(List continued on next page.)

Primary Examiner—Sara Crane
Assistant Examiner—Thien F. Tran

(57) ABSTRACT

A programmable semiconductor device and a method of manufacturing the same. The device includes: (1) a substrate composed at least in part of silicon, (2) a dielectric layer located over the substrate and (3) a control gate located over the dielectric layer wherein the dielectric layer contains a substantial concentration of an isotope of hydrogen.

9 Claims, 2 Drawing Sheets

OTHER PUBLICATIONS

Saks et al., The Time–Dependence of Post–Irradiation Interface Trap Build–up in Deuterium–Annealed Oxides, IEEE Transactions on Nuclear Science, vol. 39, No. 6, pp.: 2220–2229, Dec. 1992.*

Ohji et al., Effects of Minutes Impurities (H, OH, F) on SiO/sub2//Si Interface as Investigated by Nuclear Resonant Reaction and Electron Spin Resonance, IEEE Transactions on Electron Devices, vol. 37, No. 7, pp.: 1635–1642, Jul. 1990.*

Kjell O. Jeppson and Christer M. Svensson, Negative bias stress of MOS devices at high electric fields and degradation of MNOS devices, Journal of Applied Physics, vol. 48, No. 5, pp. 2004–2014 (May 1977).

Shigenobu Hayashi, Kikuko Hayamizu, Satoshi Mashima, Atsushi Suzuki, Peter J. Mcelheny, Satoshi Yamasaki and Akihisa Matsuda; "2D and 1H Nuclear Magnetic Resonance Study of Deuterated Amorphous Silicon and Partially Deuterated Hydrogenated Amorphous Silicon"; Japanese Journal of Applied Physics, vol. 30, No. 9A; Sep. 1991, pp. 1909–1914.

Yasutake Toyoshima, Akihisa Matsuda and Kazuo Arai; "In–Situ Investigation of the Growing a–Si :D Surface by Infrared Reflection Absorption Spectroscopy"; Journal of Non–Crystalline Solids 164–166 (1993); pp. 103–106.

N.M. Johnson, D.K. Biogelsen and M.D. Moyer; "Deuterium Passivation of Grain–Boundary Dangling Bonds in Silicon Thin Films"; Appl. Phys. Lett. 40(10), May 15, 1982; pp. 882–884.

G. Ganguly, A. Suzuki, S. Yamasaki, K. Nomoto and A. Matsuda; "Reduced Light–Induced Changes of Photoconductivity in Deuterated Amorphous Silicon"; J. Appl. Phys. 68 (7), Oct. 1, 1990; pp. 3738–3740.

J.W. Lyding, K. Hess and Isik C. Kizilyalli; "Reduction of Hot Electron Degradation in Metal Oxide Semiconductor Transistors by Deuterium Processing"; Appl. Phys. Lett. 68 (18), Apr. 29, 1996; pp. 2526–2528.

S. Sugiyama, J. Yang and S. Guha; "Improved Stability Against Light Exposure in Amorphous Deuterated Silicon Alloy Solar Cell"; Appl. Phys. Lett. 70 (3), Jan. 20, 1997; pp. 378–380.

Jerzy Kanicki; "Amorphous and Microcrystalline Semiconductor Devices: Optoelectronic Devices"; (1991) pp. 13–21.

Isik C. Kizilyalli and Jeff D. Bude; "Degradation of Gain in Bipolar Transistors"; IEEE Transaction of Electron Devices, vol. 41, No. 7, Jul. 1994; pp. 1083–1091.

S.M. Sze; "Physics of Semiconductor Devices"; A Wiley-–Interscience Publication 1981; p. 850.

Mehrdad M. Moslehi and Krishna C. Saraswat; "Formation of MOS Gates by Rapid Thermal/Microwave Remote–Plasma Multiprocessing"; IEEE Electron Device Letters, vol. EDL–8, No. 9, Sep. 1987; pp. 421–424.

* cited by examiner

INCREASED CYCLE SPECIFICATION FOR FLOATING-GATE AND METHOD OF MANUFACTURE THEREOF

TECHNICAL FIELD OF THE INVENTION

The present invention is directed, in general, to a semiconductor device and, more specifically, to a semiconductor device having a flash EEPROM structure containing a substantial concentration of deuterium therein.

BACKGROUND OF THE INVENTION

The use of silicon in semiconductor devices, such as Floating-Gate Avalanche-injection MOS transistors ("FAMOS") and Floating-Gate tunnel-oxide transistor ("FLOTOX") is well known. Equally well known is the time dependent degradation of these devices, which is often referred to as the hot carrier degradation effect. Typically, the FAMOS and FLOTOX structures have to withstand many program and erase operations, which is usually at least $10^4$ cycles. After so many program and erase operations, the threshold voltage window (i.e., the difference after program and erase) decreases due to the deterioration of the oxide quality in terms of interface traps, injection efficiency, and leakage.

It is believed that the interface traps are caused by defects that are generated by current flow in such semiconductor devices, and it is further believed that these defect states reduce the mobility and lifetime of the carriers and cause degradation of the device's performance. In most cases, the substrate comprises silicon, and the defects are thought to be caused by dangling bonds (i.e., unsaturated silicon bonds) that introduce states in the energy gap, which remove charge carriers or add unwanted charge carriers in the device, depending in part on the applied bias. While dangling bonds occur primarily at surfaces or interfaces in the device, they also are thought to occur at vacancies, micropores and dislocations, and are also thought to be associated with impurities. To alleviate the problems caused by such dangling bonds, a hydrogen passivation process has been adopted and has become a well-known and established practice in the fabrication of such devices.

In the hydrogen passivation process, it is thought that the defects that affect the operation of semiconductor devices are removed when the hydrogen bonds with the silicon at the dangling bond sites. While the hydrogen passivation process eliminates the immediate problem associated with these dangling bonds, it does not eliminate degradation permanently because the hydrogen atoms that are added by the passivation process can be "desorbed" or removed from the previous dangling bond sites by the "hot carrier effect."

A hot carrier is an electron or hole that has a high kinetic energy, which is imparted to it when voltages are applied to electrodes of the device. Under such operating conditions, the hydrogen atoms, which were added by the hydrogen passivation process, are knocked off by the hot electrons. This hydrogen desorption results in aging or degradation of the device's performance. According to established theory, this aging process occurs as the result of hot carriers stimulating the desorption of hydrogen from the silicon substrate's surface or the silicon dioxide interface. This hot carrier effect is particularly of concern with respect to smaller devices in which proportionally larger electric fields can be used.

Accordingly, what is needed in the art is a semiconductor device and a method of manufacture therefore that does experience the level of efficiency degradation experienced by the devices that are passivated with conventional hydrogen passivation processes. The present invention addresses these needs.

SUMMARY OF THE INVENTION

To address the above-discussed deficiencies of the prior art, the present invention provides a programmable semiconductor device and a method of manufacturing the same. The device includes: (1) a substrate, which in one embodiment contains at least in part silicon, (2) a dielectric layer located over the substrate and (3) a control gate located over the dielectric layer. The dielectric layer contains a substantial concentration of an isotope of hydrogen. In one embodiment of the present invention, the substrate contains at least one doped region. Those who are skilled in the art will understand that the present invention is employable to form semiconductor devices having one or more doped regions therein.

The present invention therefore introduces the broad concept of employing, in lieu of hydrogen, an isotope of hydrogen to passivate a dielectric layer in a programmable semiconductor device. For purposes of the present invention, "substantial concentration" is defined as a concentration of at least about $10^{16}$ cm$^{-3}$ of a hydrogen isotope.

In one embodiment of the present invention, the isotope is deuterium. However, the principles of the present invention may be applied to heavier isotopes of hydrogen.

In one embodiment of the present invention, the semiconductor device further comprises a floating gate proximate the control gate. The semiconductor device is selected from the group consisting of: (1) a floating-gate avalanche-injection metal oxide semiconductor transistor ("FAMOS") and (2) a floating-gate tunnel-oxide semiconductor transistor ("FLOTOX"). In one aspect of this particular embodiment, the floating gate includes a substantial concentration of the hydrogen isotope as defined above, and in another aspect, the floating gate is deuterated polysilicon. The present invention can, of course, be applied to other known or later-discovered programmable semiconductor devices.

In one embodiment of the present invention, the control gate contains a substantial concentration of a hydrogen isotope. In one aspect of this particular embodiment, the control gate is deuterated polysilicon.

In one embodiment of the present invention, the hydrogen isotope decreases interface traps between the dielectric layer and the control gate. In addition, when present, the hydrogen isotope also decreases interface traps between the substrate and the dielectric layer and between the polysilicon, control gate and the floating gate. These interface traps grow over time, eventually rendering the device harder to program. However, it is believed that the presence of the hydrogen isotope in the dielectric layer decreases the interface traps, thereby extending the number of cycles that the device can be programmed and erased.

In one embodiment of the present invention, the dielectric layer is formed from a gas selected from the group consisting of deuterated steam, deuterated tetraethylorthosilane (TEOS) or deuterated silane (SiD$_4$).

The foregoing has outlined, rather broadly, preferred and alternative features of the present invention so that those who are skilled in the art may better understand the detailed description of the invention that follows. Additional features of the invention are described below and form the subject of the claims of the invention. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction wit the accompanying drawings, in which.

DETAILED DESCRIPTION

Figure 1:
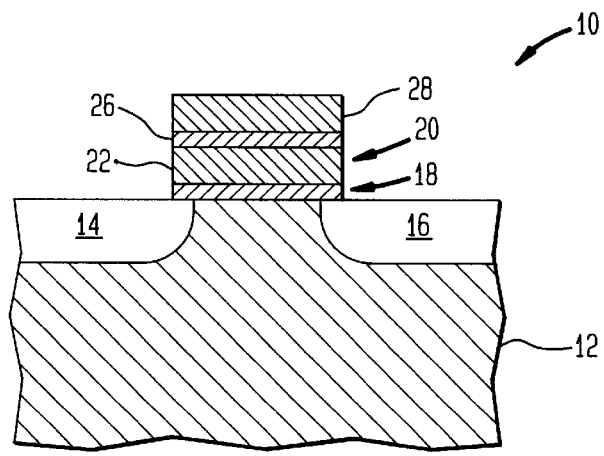
FIG. 1 illustrates a schematic cross-sectional view of a stacked-gate Flash EEPROM device.

Referring initially to FIG. 1, there is illustrated a schematic, cross-sectional partial view of a semiconductor device 10 of the present invention with a stacked-gate flash EEPROM structure 10a included therein. In advantageous embodiments, the semiconductor 10 includes a substrate 12 with source and drain regions 14 and 16, respectively, formed therein in a conventional manner. The substrate 12 may comprise silicon, germanium, gallium arsenide or other presently known or later-discovered materials that are suitable for the manufacture of such semiconductor devices. In one desirable embodiment, however, the substrate 12 is composed at least in part of silicon.

In a further aspect of this embodiment, the semiconductor 10 includes an oxide layer 18 that contains a substantial concentration of a hydrogen isotope. As used herein, the phrase "substantial concentration" is defined as a concentration of at least about $10^{16}$ cm$^{-3}$ of a hydrogen isotope. In such embodiments, the oxide layer 18 is thermally grown in the presence of an isotopic steam of hydrogen. For purposes of the present invention, the isotopic steam should have as high a concentration of the hydrogen isotope as possible. In more advantageous embodiments, however, the nonisotopic hydrogen should not exceed 1 ppm within the steam. In one advantageous embodiment, the isotopic steam is deuterium steam ($D_2O$), however, the principles of the present invention may be applied to even heavier isotopes of hydrogen, including ionic forms of the various isotopes of hydrogen.

Alternatively, the oxide layer 18 may be chemically deposited from a gas mixture containing a substantial concentration of a hydrogen isotope, such as deuterium. Representative examples of such gases and gas mixtures include: deuterated silane and oxygen ($SiD_4+O_2$), deuterated silane and nitrous oxide ($SiD_4+N_2O$), deuterated tetraethylorthosilane (TEOS, $Si(OC_2D_5)_4$), deuterated silane ($SiD_4$) or deuterated dichlorosilane and nitrous oxide ($SiCl_2D_2+N_2O$). Other gas mixtures typically used to form oxide layers within the semiconductor 10 may also be used, with the exception that they contain a substantial concentration of isotopic hydrogen. In advantageous embodiments, the ordinary or nonisotopic hydrogen should not exceed 1 ppm within the gas mixture. The hydrogen isotope is incorporated into the structure under conventional processing conditions with the exception that the gas mixture used to deposit the material contains a substantial concentration of hydrogen isotope. The pressure at which the passivation occurs may be either at, above or well below atmospheric pressures, and the flow rate of the gaseous material will depend on the equipment used for depositions. These conditions combine to form a preferred formation rate that may range from about 0.01 nm to about 10.0 nm per minute. However, in more desirable embodiments, the formation rate may vary from one layer to another and may range from about 0.5 nm to about 3 nm.

When the oxide layer 18 is passivated with the hydrogen isotope, it is believed that the dangling bond sites within it are occupied by the hydrogen isotope. It is further believed that this passivation greatly reduces degradation within the flash EEPROM device 10a because the dangling bond sites are no longer available to remove charge carriers or add unwanted charge carriers in the device. Furthermore, the hydrogen isotope may form a bond with the substrate 12 that is harder to break resulting in more reliable devices, optical or electrical. A suggested explanation why the bond is harder to break is that the hydrogen's isotopes have a heavier mass than ordinary hydrogen, which makes it more difficult to remove the isotope. Thus, the presence of the hydrogen isotope within the oxide layer 18 offers distinct advantages over the devices of the prior art.

Also illustrated in FIG. 1 is a polysilicon structure 20 that has been deposited, doped and etched using conventional processes to form a gate 22. A hydrogen isotope may be incorporated into the gate oxide 22 using conventional processes with the exception that the gas used to deposit the gate oxide 22 has a substantial concentration of a hydrogen isotope. A representative example of a gas is deuterated silane ($SiD_4$). Other gas mixtures typically used to form various polysilicon structures within the semiconductor 10 may also be used, with the exception that they contain a substantial concentration of isotopic hydrogen. In advantageous embodiments, the ordinary or nonisotopic hydrogen should not exceed 1 ppm within the gas mixture. Conventional processes are used to deposit the material with the exception that the gas contains a substantial concentration of isotopic hydrogen. The pressure at which the passivation occurs may be either at, above or well below atmospheric pressures, and the flow rate of the gaseous material will depend on the equipment used for depositions. These conditions combine to form a preferred formation rate that may range from about 0.01 nm to about 10.0 nm per minute. However, in more desirable embodiments, the formation rate may range from about 0.5 nm to about 3 nm.

Formed over the gate 22 is a dielectric layer 26. This dielectric layer 26 is formed using conventional process, with the exception that it may be formed from a gas mixture containing a substantial concentration of a hydrogen isotope, such as deuterium. Representative examples of such gases mixtures include: deuterated silane and oxygen ($SiD_4+O_2$), deuterated silane and nitrous oxide ($SiD_4+N_2O$), deuterated tetraethylorthosilane (TEOS, $Si(OC_2D_5)_4$), deuterated silane ($SiD_4$) or deuterated dichlorosilane and nitrous oxide ($SiCl_2D_2+N_2O$). Other gas mixtures typically used to form such layers within the semiconductor 10 may also be used, with the exception that they contain a substantial concentration of isotopic hydrogen. In advantageous embodiments, the ordinary or nonisotopic hydrogen should not exceed 1 ppm within the gas mixture. Conventional processes are used to deposit the material with the exception that the gas contains a substantial concentration of isotopic hydrogen. The pressure at which the passivation occurs may be either at, above or well below atmospheric pressures, and the flow rate of the gaseous material will depend on the equipment used for depositions. These conditions combine to form a preferred formation rate that may range from about 0.01 nm to about 10.0 nm per minute. However, in more desirable embodiments, the formation rate may range from about 0.5 nm to about 3 nm. It should be understood, however that the deposition rate may vary from those stated above, depending on the desired thickness and uniformity of the layer.

When the dielectric layer 26 is passivated with the hydrogen isotope, it is believed that the dangling bond sites within it are occupied by the hydrogen isotope as previously explained. This stronger hydrogen isotope/silicon bond provides a dielectric layer that is most likely more robust and that has a substantially lower rate of degradation.

Continuing to refer to FIG. 1, there is also illustrated a control gate 28 structure formed over the dielectric layer 26. The control gate 28 may be formed by conventional processes and materials, such as polysilicon. In one alternate embodiment, however, the control gate 28 may include a doped polysilicon containing a substantial concentration of a hydrogen isotope. In such embodiments, the control gate 28 is formed by conventional processes, with the exception that the gas used to form the control gate 28 includes a substantial concentration of a hydrogen isotope, for example, deuterated silane, $SiD_4$.

It is believed that when a hydrogen isotope is incorporated into the gate 22, dielectric layer 26 or control gate 28, there is provided a resulting stacked-gate flash EEPROM structure that is capable of withstanding a larger number of program and erase cycles without a deterioration of the oxide quality in terms of interface traps, injection efficiency and leakage.

Figure 2:
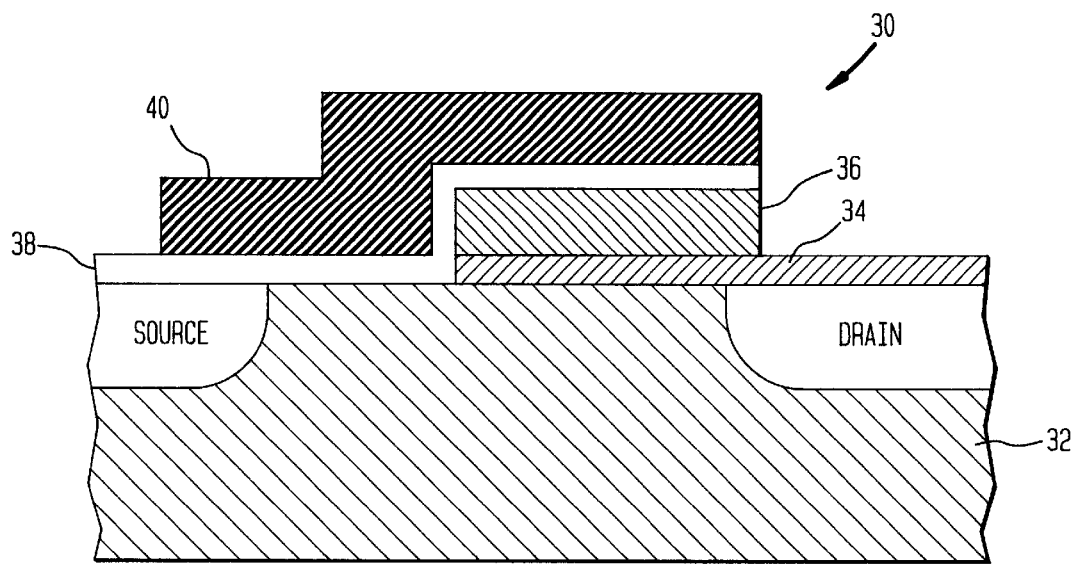
FIG. 2 illustrates a schematic cross-sectional view of a split-gate Flash EEPROM device.

Turning now to FIG. 2, there is illustrated a split-gate flash EEPROM device 30 that may also be used in a semiconductor device. In one embodiment, the split-gate EEPROM device 30 is formed over a semiconductor substrate 32 that has been doped and formed in accordance with conventional processes. A split-gate gate oxide 34, or tunneling oxide, is formed over the substrate using conventional processes. However, if so desired, a hydrogen isotope may be incorporated into the split-gate gate oxide 34 in the same manner as discussed above for the stacked-gate structure.

The spilt-gate EEPROM device 30 further includes a floating gate 36. Like the case with the floating gate in the stacked-gate EEPROM device, the floating gate 36, which is preferably comprised of a polysilicon material, may be formed by conventional processes. Alternatively, however, it may have a substantial concentration of a hydrogen isotope incorporated into it by the same process discussed above for the floating gate of the stacked-gate structure.

Formed over the floating gate 36 is a dielectric layer 38. In an advantageous embodiment, the dielectric layer 38 includes a substantial concentration of a hydrogen isotope, which may be incorporated into dielectric layer 38 in the same manner as discussed above for the dielectric layer of the stacked-gate structure.

The split-gate EEPROM device 30 also includes a control gate 40. The control gate 40 is formed according to conventional processes. Alternatively, the control gate 40 may have a substantial concentration of a hydrogen isotope incorporated therein using the same materials and processes as discussed above for the control gate of the stacked-gate structure.

It is believed that when a hydrogen isotope is incorporated into the split-gate tunnel-oxide 34, floating gate 36, dielectric layer 38 or control gate 40, there is provided a resulting split-gate flash EEPROM structure that is capable of withstanding a larger number of program and erase cycles without a deterioration of the oxide quality in terms of interface traps, injection efficiency and leakage. While stacked-gate and split-gate structures have been specifically discussed, it is readily apparent that other EEPROM and flash EEPROM structures are included within the scope of the present invention.

Alternatively, or in addition to the processes discussed above, the hydrogen isotope may be incorporated into the semiconductor device either at any time during the manufacturing process or at the end of the process and just prior to the capping of the device. In such embodiments, the hydrogen isotope is introduced at temperatures ranging from about 200° C. to about 1000° C. in a forming gas anneal step for time periods ranging from about 10 minutes to 2 hours or more. The forming gas may be, for example, a mixture of nitrogen and the hydrogen isotope, or a mixture of nonisotopic hydrogen and the hydrogen isotope. This annealing step is well known with the exception that a hydrogen isotope is present and is present within the gas mixture in a substantial concentration as discussed above.

Figure 3:
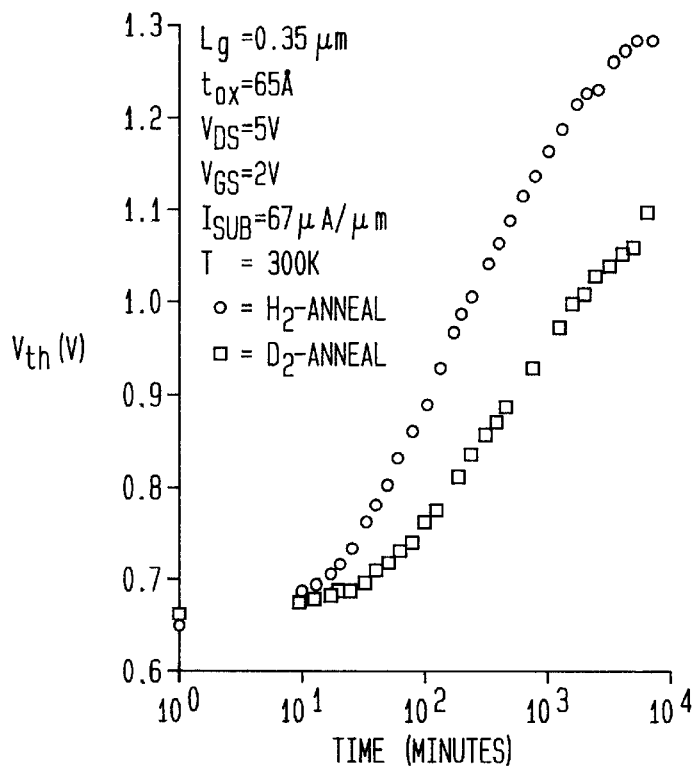
FIG. 3 illustrates a graph that shows hot carrier stress experiments conducted on a transistor at peak substrate current conditions; and, FIG. 4 illustrates a transistor lifetime versus substrate current.

FIG. 3 is a graph that illustrates hot carrier stress experiments conducted on transistors at peak substrate current conditions. The interface damage, caused by hot carriers, is observed by monitoring the change in the linear transconductance ($g_m$) and threshold voltage ($V_{th}$) of the NMOS transistor. FIG. 3 also shows the $V_{th}$ degradation as a function of stress time. As shown by the graph, the degradation of the transistor passivated with hydrogen is significantly higher than the degradation observed for the device passivated with deuterium. The threshold voltage for the deuterium passivated device increases to only about 1.05 volts over a period of $10^4$ minutes whereas at that same period of time, the threshold voltage for the hydrogen passivated device increases to 1.3 volts.

Figure 4:
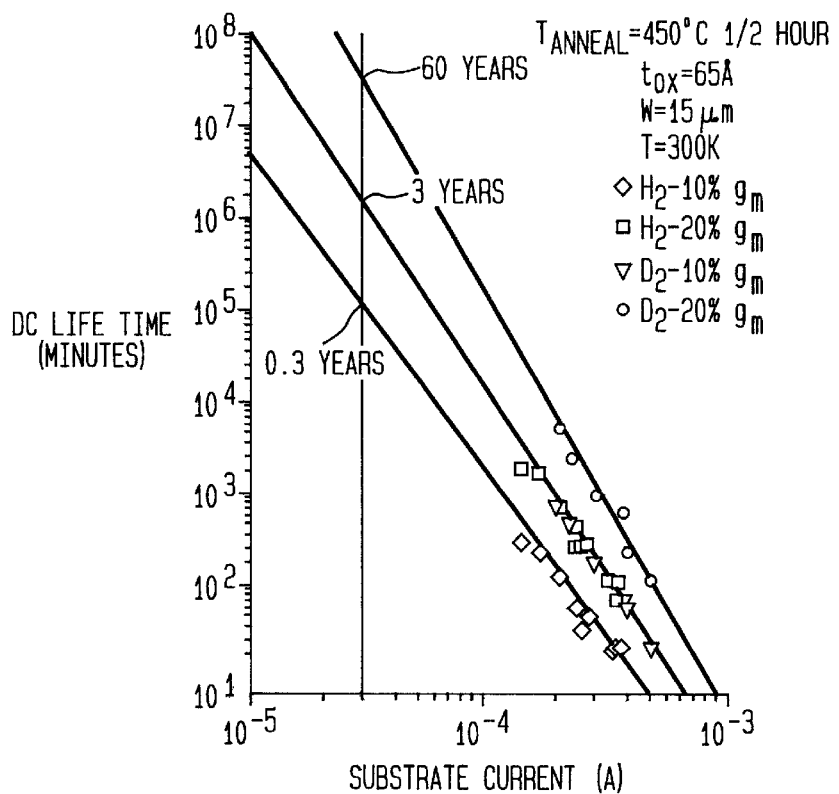

FIG. 4 shows NMOS transistor lifetime versus substrate current. From this data it is evident that devices annealed in hydrogen isotopes, such as deuterium, are much more robust under channel hot electron stress. The extrapolated transistor lifetimes are indicated using various degradation criteria. The large lifetime differences between the hydrogen anneal and the deuterium anneal processes is apparent. Given the similar structures between the NMOS and the semiconductor devices covered by the present invention, it is apparent that the same results could be expected in semiconductor devices as appears in the NMOS devices.

The foregoing has outlined, rather broadly, preferred and alternative features of the present invention so that those who are skilled in the art may better understand the detailed description of the invention that follows. Additional features of the invention that form the subject of the claims of the invention are described below. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

What is claimed is:

1. A programmable semiconductor device, comprising:

a substrate;

a dielectric layer located over said substrate; and a control gate located over said dielectric layer, said dielectric layer containing a concentration of at least about $10^{16}$ cm$^{-3}$ of deuterium, wherein a concentration of hydrogen does not exceed 1 part per million of the concentration of deuterium, said concentration of deuterium substantially reducing degradation associated with hot carrier stress.

2. The semiconductor device as recited in claim 1 further comprising a floating gate proximate said control gate, said semiconductor device being selected from the group consisting of:

a floating-gate avalanche-injection metal oxide semiconductor transistor (FAMOS), and a floating-gate tunnel-oxide semiconductor transistor (FLOTOX).

3. The semiconductor device as recited in claim 2 wherein said floating gate includes a substantial concentration of said hydrogen isotope.

4. The semiconductor device as recited in claim 3 wherein said floating gate is deuterated polysilicon.

5. The semiconductor device as recited in claim 1 wherein said control gate contains a substantial concentration of hydrogen isotope.

6. The semiconductor device as recited in claim 5 wherein said control gate is deuterated polysilicon.

7. The semiconductor device as recited in claim 1 wherein said isotope decreases interface traps between said dielectric layer and said control gate.

8. The semiconductor device as recited in claim 1 wherein said dielectric layer is formed from a gas source selected from the group consisting of:

deuterated steam, deuterated silane, and deuterated tetraethylortho silane (TEOS).

9. The semiconductor device as recited in claim 1 wherein said substrate is comprised of silicon and contains at least one doped region.

\* \* \* \* \*